US005773842A

United States Patent [19]
Kim et al.

[11] Patent Number: 5,773,842
[45] Date of Patent: Jun. 30, 1998

[54] RESONANT-TUNNELLING HOT ELECTRON TRANSISTOR

[75] Inventors: Gyung-Ok Kim; Ho-Hyung Suh, both of Daejeon, Rep. of Korea

[73] Assignee: Electronics and Telecommunications Research Institute, Daejon-shi, Rep. of Korea

[21] Appl. No.: 567,579

[22] Filed: Dec. 5, 1995

[30] Foreign Application Priority Data

Dec. 19, 1994 [KR] Rep. of Korea ................. 94-35155

[51] Int. Cl.⁶ ............................................. H01L 29/06
[52] U.S. Cl. .............................. 257/25; 257/26; 257/29
[58] Field of Search .......................... 257/25, 26, 29, 257/197, 198

[56] References Cited

U.S. PATENT DOCUMENTS

| | | | |
|---|---|---|---|
| 5,278,427 | 1/1994 | Choi ........................................ | 257/26 |
| 5,389,798 | 2/1995 | Ochi et al. ............................. | 257/25 |

FOREIGN PATENT DOCUMENTS

0186301A1  7/1986  European Pat. Off. .

OTHER PUBLICATIONS

Chen, et al.: "Experimental Realization of a New Transistor"; pp. 267–272; IEEE Transactions on Electron Devices, vol. 40, No. 2, Feb. 1993.

Seo, et al.: "Pseudomorphic InGaAs Base Ballistic Hot–Electron Device"; pp. 1946–1948, Appl. Phys. Lett. 53(20), 14 Nov. 1988.

Imamura, et al.: "In GaAs/In(AlGa)As RHET's with InAs Pseudomorphic Base"; pp. 479–483, IEEE Transactions On Electron Devices, vol. 39, No. 3, Mar. 1992.

*Primary Examiner*—Mark V. Prenty
*Attorney, Agent, or Firm*—Jacobson, Price, Holman & Stern, PLLC

[57] ABSTRACT

A resonant-tunnelling hot transistor includes buffer layers undoped with impurities on either side of a collector or an emitter potential barrier having a quantum well structure. When a voltage is applied to the transistor, most of the potential drop occurs at the first buffer layer and the second buffer layer due to their thickness. This enables the inclination of the energy band of the collector barrier layer or the emitter barrier layer to be diminished, whereby the energy of the confined energy state $E_{QW}$ of the quantum well and the energy change of the confined state is diminished. In addition, the NDR region of I-V characteristics curve can be moved by controlling the biasing voltage, and the wave form of the curve maintains its original form.

10 Claims, 2 Drawing Sheets

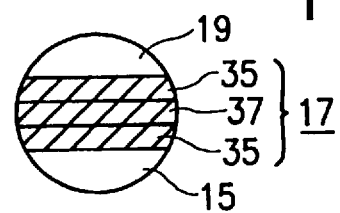
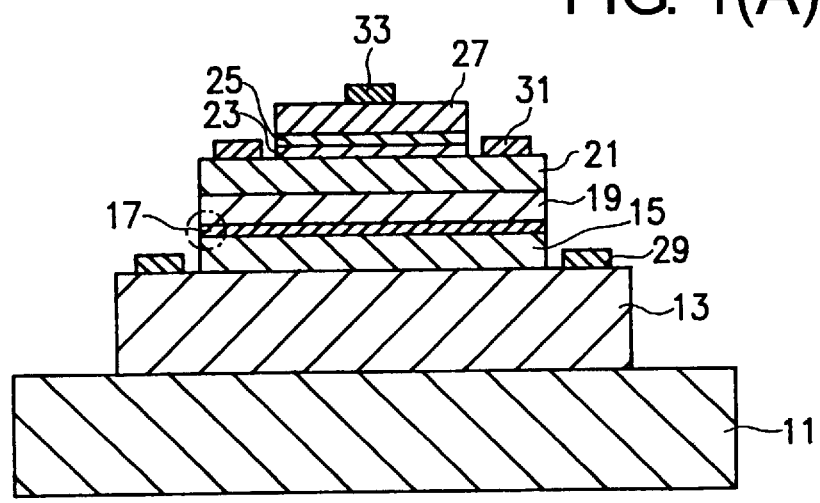
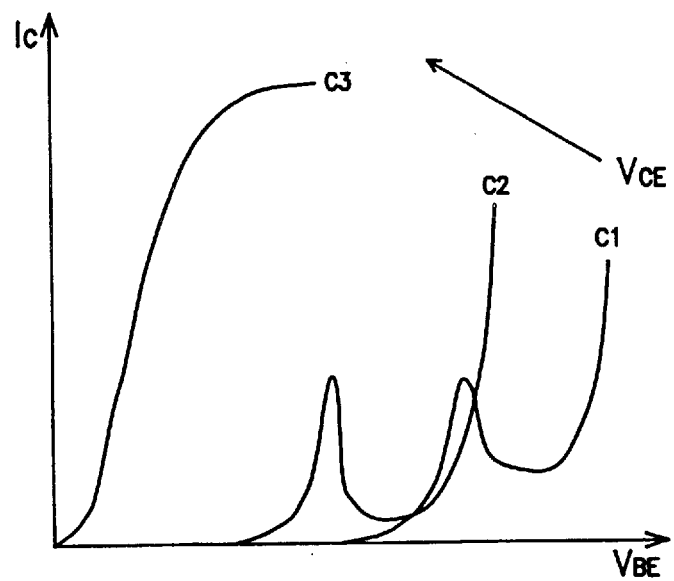

5,773,842

RESONANT-TUNNELLING HOT ELECTRON TRANSISTOR

BACKGROUND OF THE INVENTION

1. Field of the Invention

The present invention relates to a Resonant-tunnelling Hot Electron Transistor, and more particularly to a Resonant-tunnelling Hot Electron Transistor which is capable of diminishing the inclination factor in a quantum well when a voltage has been applied, whereby the variance of the energy level $E_{QW}$ of the confined state of the quantum well and the amount of energy variance are reduced.

2. Description of the Prior Art

Along with the development of epitaxial growth technique such as Molecular Beam Epitaxy (MBE) and Metal Oxide Chemical Vapor Deposition (MOCVD), the semiconductors using heterojunction structure have been proposed. Among the semi-conductors, many technicians have been very interested in hot electron transistor having a short transition time for passing through a base region.

The resonant-tunnelling hot electron transistor is obtained by adapting a heterojunction quantum well structure to a hot electron transistor structure. At this time, hot electrons perform a resonant tunnelling operation after passing through the quantum well.

Therefore, the resonant tunnelling hot electron transistor is operated at a high frequency, and its I-V curve indicates Negative Differential Resistance (hereinafter referred to as NDR) characteristics. These characteristics enable switching circuits and high speed logic circuits to effectively be utilized.

Conventional resonant-tunnelling hot electron transistor is described in EP Appln. No. 85308371.5. The conventional resonant-tunnelling hot electron transistor has a quantum well layer, acting as a hot electron injector, between an emitter layer and a base layer. If the bias voltage is applied to the base layer of the above transistor, the electrons flow from the emitter layer to the base layer and thereafter to the collector layer, by generating a resonant-tunnelling phenomenon. By this operation, a collector current Ic is created. In the conventional resonant-tunnelling hot transistor, the corrector current Ic may be increased until reaching a predetermined bias voltage, while it is decreased beyond the predetermined voltage. As explained above, these characteristics may be effectively utilized in the switching circuit and the logic circuits.

However, the conventional resonant-tunnelling hot transistor has a problem in that the NDR region is fixed at the current-voltage characteristic curve by a confined state of the quantum well layer between the emitter and the base layer. Also, there is another problem in that due to the large electric potential difference and the abruptly inclined energy band, the confined quantum energy by which the electron is resonant tunnelled is increased and the energy width of the confined state becomes broadened, thereby degrading the NDR characteristics.

SUMMARY OF THE INVENTION

The present invention has an object to provide a resonant tunnelling hot electron transistor in which change there is a of the energy width and the position of the confined energy level $E_{QW}$ in the quantum well by making the inclination of the energy band of the quantum well due to the applied voltage sufficiently small by forming the quantum well between the buffer or wide spacer layers.

The other object of the present invention is to provide a resonant tunnelling hot electron transistor having an accurate NDR of the current-voltage characteristic curve by adjusting the NDR region of the current-voltage characteristic curve applied to the voltage.

To achieve the above objects, there is provided a resonant-tunnelling hot electron transistor which comprises a compound semiconductor substrate; a conductive collector layer formed on said compound semiconductor substrate; a first buffer or wide spacer layer undoped with impurities, formed on said conductive collector layer; a collector potential barrier layer, having Quantum well structure, formed on said first buffer layer; a second buffer layer undoped with impurities, formed on said collector potential barrier layer; a conductive base layer, having the same conductivity type with said collector, formed on said second buffer layer; an emitter barrier layer undoped with impurities, formed on the predetermined region of said base layer; and an emitter layer, having the same conductivity type as said base layer and formed on said emitter barrier layer.

BRIEF DESCRIPTION OF THE DRAWINGS

The characteristic features of the present invention will become more apparent from the description given in further detail hereinbelow with reference to the accompanying drawings, in which:

FIG. 1 is a sectional view of a resonant-tunnelling hot electron transistor according to the present invention, FIG. 3 is a graph showing the relationship between the voltage $V_{BE}$ and the current $I_C$, in accordance with the present invention.

DETAILED DESCRIPTION OF THE PREFERRED EMBODIMENT

Figure 2A:
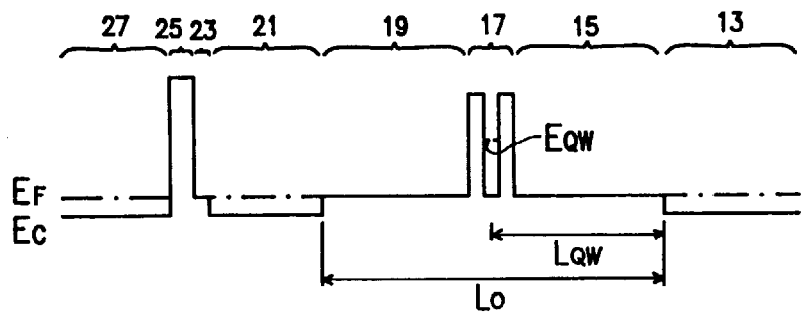
FIGS. 2A to 2D are waveform diagrams of a resonant-tunnel hot electron transistor according to the present invention.
Figure 2B:
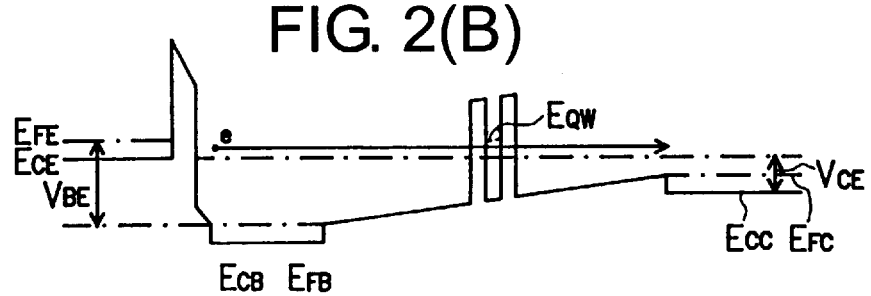

FIG. 1 is a sectional view of a resonant-tunnelling hot electron transistor according to the present invention. In this resonant-tunnelling hot electron transistor, N-type GaAs collector layer 13 is formed on a semi-insulating GaAs substrate 11, and a first buffer layer 15, which is undoped, is formed thereon. A collector potential barrier layer 17 is formed on the first buffer layer 15 and a second buffer GaAs layer 19 is formed thereon. An N-type GaAs base layer 21 is formed on the second buffer GaAs layer 19 and an undoped GaAs spacer layer 23 is formed on the N-type GaAs base layer 21. An undoped AlGaAs emitter barrier layer 25 is formed on the undoped GaAs spacer layer 23 and an N-type GaAs emitter layer 27 is formed on the undoped AlGaAs emitter barrier layer 25. All of these layers are formed by an epitaxial growth method. An emitter electrode 33, a base electrode 31 and a collector electrode 29 are, respectively, formed on the emitter layer 27, the base layer 21 and collector layer 13.

The collector layer 13 having a thickness of 1 to 1.5 μm is formed by doping N-type impurity with $1 \times 10^{18}/cm^3$ to $5 \times 10^8/cm^3$. The collector potential barrier layer 17, which gives rise to a resonant-tunnelling has a quantum well structure in which a barrier layer 35/Quantum well layer 37/barrier layer 35 are sequentially formed. This structure is achieved by 1 period to 3 periods.

The barrier layer 35 is an undoped AlGaAs layer with a thickness of 2 to 100 Å and the quantum well layer 37 is an undoped GaAs layer with a thickness of 20 to 100 Å.

The first and second buffer layers 15 and 19, which are not doped with an impurity, are respectively formed with a thickness of 500 Å to 2000 Å, and the collector potential barrier layer 17 is formed therebetween.

If a predetermined voltage $V_{BE}$ or a voltage $V_{CE}$ is applied, due to the first buffer layer 15 and the second buffer layer 19, an abrupt variance of an energy barrier of the collector potential barrier layer 17 is diminished. That is, the voltage VCE is applied to not only collector potential barrier layer 17 having a narrow energy barrier width, but also to the first buffer layer 15 and the second buffer layer 19 in order to vary the band of wide layer, whereby the incline of an energy band for the collector potential barrier layer 17 is diminished.

A base layer 21 is formed on the second buffer layer 19 by doping N-type impurity with a concentration of $1\times10^8$ to $5\times10^{18}/cm^3$, and has a thickness of 200 Å to 1000 Å.

Spacer layer 23 and emitter barrier layer 25 are not doped and, respectively, have a thickness in the range of 30 to 100 Å. The spacer layer 23 prevents the impurities of the base layer 21 from diffusing to emitter layer 27.

The emitter layer 27 is formed on the emitter barrier layer 25 by doping N-type impurity with a concentration of $1\times10^{18}$ to $5\times10^{18}/cm^3$, and has a thickness in the range of 2000 to 10,000 Å. The emitter barrier layer 25 is formed with AlGaAs having a thickness of 50 to 150 Å.

FIG. 2 is a diagram of an energy band of a resonant-tunnelling hot electron transistor of the present invention.

FIG. 2A shows a thermal equilibrium state because of the voltage $V_{BE}$ and the voltage $V_{CE}$. As shown in the drawing, the Fermi level of the base region 21 is lower than the Fermi level of the emitter region, and the Fermi level of the collector region 13 in proportion to the applied voltage may be lowered.

As a result, the energy bands of the collector potential barrier layer 17, the first buffer layer 15 and the second buffer layer 19 are somewhat inclined toward the base layer 21, and therefore an electron travelling from the emitter layer 27 to the base layer 21 must pass through the collector potential barrier layer 17 by a resonant-tunnel method in order to make the collector current Ic flow. The resonant-tunnelling is performed in the vicinity of the Fermi level region. The electron passes through the confined energy level $E_{QW}$ of the quantum well by the resonant-tunnelling method, whereby collector current Ic has NDR characteristics.

Figure 2C:
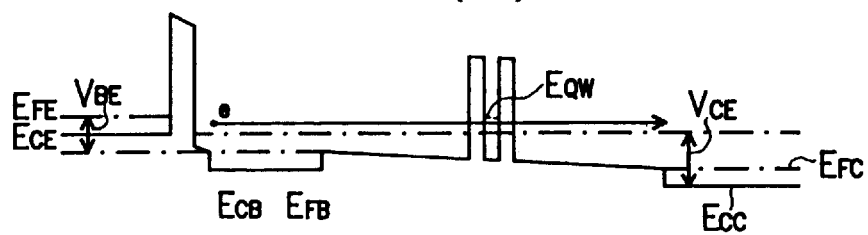
Figure 2D:
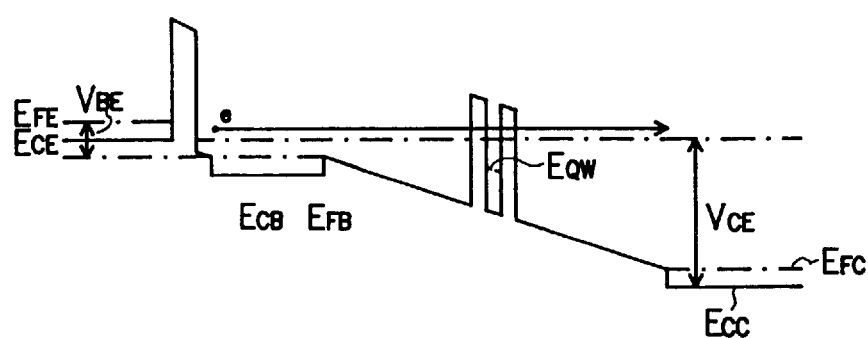

FIG. 2C shows a voltage bias state in which the voltage $V_{CE}$ is larger than the voltage $V_{BE}$. As shown in the drawings, the Fermi level of the base region is lower than that of the emitter, and the Fermi level of the collector region 13 is also lowered due to the applied voltage.

As a result, the energy bands of the collector potential barrier layer 17, the first buffer layer 15 and the second buffer layer 19 are somewhat inclined toward the collector layer 21. Herein, since the electrons which are implanted from the emitter layer 27 to the base layer 21 pass through the confined energy level $E_{QW}$ of the quantum well of the collector potential barrier layer 17 by resonant-tunnelling, the collector current Ic has NDR characteristics.

FIG. 2 shows a voltage bias state in which a voltage $V_{CE}$ is much larger than a voltage $V_{BE}$. As shown in the drawing, the Fermi level of the base is lower than the Fermi level of emitter, and the Fermi level of the collector region 13 may be lowered much more due to the applied voltage.

As a result, the energy bands of the collector potential barrier layer 1, the first buffer layer 15 and the second buffer layer 19 have an abrupt inclination toward the collector layer 13 such that the Fermi level $E_F$ of the emitter layer 27 is higher than the confined energy level $E_{QW}$ of the quantum well of the collector potential barrier layer. Herein, the electrons which are implanted from the emitter layer 27 to the base layer 21 pass through the collector potential barrier layer 17 in order to make the collector current Ic flow in which a resonant-tunnelling operation is not performed because the energy of the passing electron is higher than that of the confined energy level $E_{QW}$ of the quantum well of the collector potential barrier layer 17. Accordingly, the collector current Ic has NDR characteristics and the resonant-tunnelling hot transistor in the preferred embodiment is identically operated general transistors.

As described above, the resonant-tunnelling collector current Ic passing through the confined energy level $E_{QW}$ of the quantum well may be controlled according to the magnitude of the voltage $V_{BE}$ and the voltage $V_{CE}$.

Also, the NDR region of I-V characteristics is not limited and the applied voltage $V_{BE}$ and $V_{CE}$ act as a variable factor. That is, the peak voltage $V^P_{BE}$, $V^P_{CE}$ of the resonant-tunnelling collector current depending upon the voltage $V_{BE}$ and the voltage $V_{CE}$ is expressed as:

$$E_{QW} - (V^P_{BE} - V^P_{CE})\frac{L_{QW}}{LO} - V^P_{CE} = E_F$$

$$(E_{QW} - E_F - V^P_{CE})\frac{LO}{L_{QW}} + V^P_{CE} = V^P_{BE}$$

wherein $V^P_{BE}$ is the peak voltage of the resonant-tunnelling collector current Ic depending upon the voltage $V_{BE}$, $V^P_{CE}$ is the peak voltage of the resonant-tunnelling collector current Ic depending upon the voltage $V_{VB}$ and the voltage $V_{CE}$, $L_{QW}$ is the length between the collector layer 13 and the collector potential barrier layer 17, and Lo is the length between the collector 13 and the base 21. In the above explanation, we can obtain $V^P_{BE}$ as FIG. 3 is a graph showing the relationship between the voltage $V_{BE}$ and the current Ic in accordance with the present invention. As shown in FIG. 3, the horizontal axis indicates the voltage $V_{BE}$ and the vertical axis indicates the current Ic. Reference numerals Cl to C3 indicate the collector current Ic of energy band diagram in FIG. 2B to FIG. 2D.

As best shown in the drawings, C1 and C2 indicate NDR characteristics of the collector current Ic and C3 indicates a general transistor characteristic. By controlling the voltage $V_{CE}$ with respect to the voltage $V_{BE}$ and I-V characteristic graph having NDR characteristics may be moved while maintaining the original form.

As explained above, the resonant-tunnelling hot transistor in accordance with the present invention comprises the first buffer layer and the second buffer layer, formed on either side of the collector potential barrier layer has a quantum well structure which is not doped by impurities.

By this structure, most of the potential drop of the applied bias is reduced not only at collector potential barrier layer having narrow energy band width, but also at the first buffer layer and the second buffer layer.

This enables the inclination of the energy band of the collector to be diminished, whereby the variance of the energy level $E_{QW}$ of the confined state of the quantum well and the energy broadening of a confined state are reduced. Also, the NDR region of I-V curve characteristics may be moved by controlling the bias voltage such as $V_{BE}$ and $V_{CE}$.

What is claimed is:

1. A resonant-tunnelling hot electron transistor comprising:
   a compound semiconductor substrate;
   a conductive collector layer formed on said compound semiconductor substrate;
   a first buffer layer undoped with impurities, formed on said conductive collector layer;
   a collector potential barrier layer, having Quantum well structure, formed on said first buffer layer;
   a second buffer layer undoped with impurities, formed on said collector potential barrier layer;
   a conductive base layer, having the same conductivity type with said collector, formed on said second buffer layer;
   an emitter barrier layer undoped with impurities, formed above said base layer;
   an emitter layer, having the same conductivity type with said base layer, formed on said emitter barrier layer; and
   a spacer layer between said base layer and the emitter layer.

2. A resonant-tunnelling hot electron transistor according to claim 1, wherein said collector layer is N-type.

3. A resonant-tunnelling hot electron transistor according to claim 1, wherein said first buffer layer and said second buffer layer is made of GaAs.

4. A resonant-tunnelling hot electron transistor according to claim 3, wherein said first buffer layer and second buffer layer have a thickness of 500 Å to 2000 Å.

5. A resonant-tunnelling hot electron transistor according to claim 1, wherein said collector potential barrier layer has at least one of barrier layer/well layer/barrier layer structure.

6. A resonant-tunnelling hot electron transistor according to claim 5, said collector potential barrier layer has a thickness of 20 Å to 100 Å of AlGaAs undoped with impurities.

7. A resonant-tunnelling hot electron transistor according to claim 5, wherein said well layer has a thickness of 20 to 100 Å of GaAs undoped with impurities.

8. A resonant-tunnelling hot electron transistor according to claim 1, wherein said spacer layer has a thickness of 30 Å to 100 Å undoped with impurities.

9. A resonant-tunnelling hot electron transistor according to claim 1, wherein said emitter layer have a thickness of 2,000 Å to 10,000 Å.

10. A resonant-tunnelling hot electron transistor according to claim 1, wherein said emitter barrier layer have a thickness of 50 Å to 1,500 Å undoped with impurities.

* * * * *